US007737664B2

(12) United States Patent
Matsunaga

(10) Patent No.: US 7,737,664 B2
(45) Date of Patent: Jun. 15, 2010

(54) BATTERY PROTECTIVE DEVICE AND SEMICONDUCTOR INTEGRATED CIRCUIT DEVICE

(75) Inventor: Shinichiro Matsunaga, Matsumoto (JP)

(73) Assignee: Fuji Electric Systems Co., Ltd., Tokyo (JP)

( * ) Notice: Subject to any disclaimer, the term of this patent is extended or adjusted under 35 U.S.C. 154(b) by 22 days.

(21) Appl. No.: 12/149,767

(22) Filed: May 7, 2008

(65) Prior Publication Data

US 2008/0278116 A1     Nov. 13, 2008

(30) Foreign Application Priority Data

May 8, 2007     (JP)     ............... 2007-123586

(51) Int. Cl.
*H02J 7/00*     (2006.01)
(52) U.S. Cl. ................... 320/134; 361/90; 320/136
(58) Field of Classification Search ................ 320/128, 320/134, 136; 361/79, 90, 91.5
See application file for complete search history.

(56) References Cited

U.S. PATENT DOCUMENTS 6,320,355 B1 *   11/2001   Terada ..................... 320/136
6,977,513 B2 *   12/2005   Matsunaga ............... 324/713
7,068,012 B1 *   6/2006    Geren et al. .............. 320/134
7,190,148 B2 *   3/2007    Ooshita et al. ............ 320/134
2006/0139006 A1 *  6/2006   Wang et al. .............. 320/134

FOREIGN PATENT DOCUMENTS

JP     10290530     10/1998
JP     2002204534    7/2002

* cited by examiner

*Primary Examiner*—Edward Tso
*Assistant Examiner*—Ramy Ramadan
(74) *Attorney, Agent, or Firm*—Rabin & Berdo, P.C.

(57) ABSTRACT

A battery protective device that protects against battery damage and semiconductor destruction from overdischarge and overcharge of the battery. Resistance across switching elements is controllable to prevent current leakage through parasitic dipole elements in the integrated circuit. Current is detected with an overdischarge detecting circuit and an overcharge detecting circuit. Direction of the current to/from the battery is detected by discharge overcurrent and charge overcurrent detecting circuits. Switching discharge FETs and charge FETs are enabled as independently controlled, ON-OFF parallel switching elements, interposed in series in the charge/discharge current path of the battery. Only a part of the discharge or charge switching FETs can be turned ON and OFF for accurate current control in accordance with the detected current and its direction.

9 Claims, 10 Drawing Sheets

FIG. 10 PRIOR ART
| BATTERY STATE | NORMAL | | OVERCHARGE | OVERDISCHARGE |
|---|---|---|---|---|
| CURRENT | NORMAL CHARGE / DISCHARGE | DISCHARGE OVERCURRENT | CHARGE | DISCHARGE |
| CHARGE FETQ2 | ON | ON | OFF | ON |
| DISCHARGE FETQ1 | ON | OFF | ON | OFF |
FIG. 11A PRIOR ART
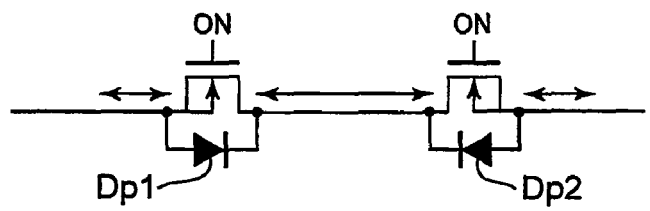
FIG. 11B PRIOR ART
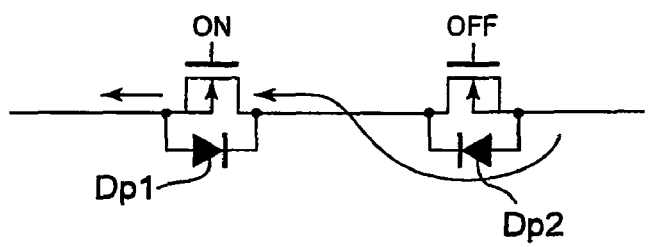
FIG. 11C PRIOR ART
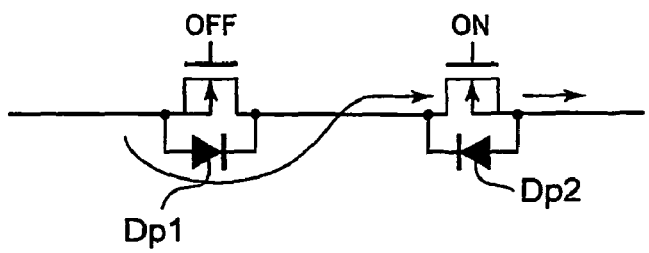

BATTERY PROTECTIVE DEVICE AND SEMICONDUCTOR INTEGRATED CIRCUIT DEVICE

FIELD OF THE INVENTION

The present invention relates to a battery protective device and to a semiconductor integrated circuit device which protects a battery, such as a lithium ion battery. More particularly, the invention is directed to an apparatus and method for protecting the battery by preventing thermal destruction of a semiconductor device that controls charge and discharge current of the battery.

BACKGROUND OF THE INVENTION

A battery pack which holds a battery, such as a lithium ion battery, contains a protective integrated circuit which protects the battery, such as a secondary battery, from overdischarge and overcharge. FIG. 6 is a block diagram which shows a circuit structure of a conventional battery protective device contained in a battery pack, wherein the battery pack 1 is connected to a charger 2.

The battery pack 1 is comprised of a discharge FET Q1, which is a discharge control semiconductor device, a charge FET Q2, which is a charge control semiconductor device, and a discharge control circuit 101 and a charge control circuit 102, which control the ON and OFF states of the discharge FET Q1 and charge FET Q2, respectively. Battery pack 1 further contains an overdischarge detecting circuit 103 which detects overdischarge of the battery 10, an overcharge detecting circuit 104, which detects overcharge of the battery 10, and a discharge overcurrent detecting circuit 105, which detects discharge overcurrent of the battery 10 in a normal state. Dp1 and Dp2 are parasitic diodes of the discharge FET Q1 and the charge FET Q2, respectively. S1 and S2 denote sources, D1 and D2 denote drains, and G1 and G2 denote gates.

Battery pack 1 contains plus (+) and minus (−) output terminals of the battery 10. These output terminals become input terminals which input charge current from a charge circuit 20 of a charger 2 when the battery 10 is being charged.

Operation of the battery protective device is described with reference also to FIG. 7, which shows the charging characteristic of the battery 10, wherein a battery voltage and charge current of the battery 10 are shown (vertical axis) over time (horizontal axis). For illustrative purposes, the overcharge detecting voltage is 4.3 volts (V), the voltage released from overcharge is 4.0V, the overdischarge detecting voltage is 2.5V and the voltage released from overdischarge is 2.8V.

When charger 2 is connected to battery pack 1, the charger 2 charges the battery 10 using a constant-current charging and constant-voltage charging if the battery voltage is detected to be lower than a predetermined voltage. As shown in FIG. 7, when a normal charger 2 charges with a constant-voltage charge of 4.2V, the battery 10 will not be overcharged. However, if a "fault charger" or the like (such as a non-constant-current or non-constant-voltage charger) is connected to the battery, and the battery is being charged with a voltage over 4.2V, any overcharge voltage, for example of 4.3V, is detected and an overcharge protecting operation is executed.

FIG. 8 is a time chart which shows an overcharge protecting operation of a conventional battery protective device. The chart shows (A) a gate voltage of the discharge FET Q1, (B) a gate voltage of the charge FET Q2, (C) overcharge detecting voltage (overcharge detecting signal), (D) voltage between sources S1-S2 of the discharge FET Q1 and the charge FET Q2 (S1-S2 voltage signal), (E) the state of the battery pack and (F) voltage of the battery 10 (battery voltage).

The overcharge detecting circuit 104 (FIG. 6) monitors the battery voltage in order that battery 10 is not overcharged. When the detected voltage is lower than a predetermined overcharge detecting voltage (4.3V), the overcharge detecting circuit 104 outputs a "L" level (LOW) signal that informs the charge control circuit 102 that the battery is in a normal state. When the battery is in a normal state, the charge control circuit 102 turns the gate G2 of the charge FET Q2 to a "H" level (HIGH) signal, thus FET Q2 turns ON and conducts charge current. When the overcharge detecting circuit 104 detects a higher voltage than the predetermined overcharge detecting voltage (at time t1), the overcharge detecting circuit 104 turns its output to an H level, which informs the charge control circuit 102 of an overcharge state. In the overcharge state, the charge control circuit 102 turns the gate G2 of charge FET Q2 to an L level which turns FET Q2 OFF and cuts off the charge current to protect battery 10 from overcharge.

Thereafter, when the battery 10 is disconnected from the fault charger or the like and is connected to a load, a discharge current starts to flow. When the overcharge detecting circuit 104 senses a voltage lower than the predetermined release voltage (4.0V) caused by overcharge (time t2), the overcharge detecting circuit 104 turns its output signal to an L level, which informs the charge control circuit 102 that the overcharge state is released. Then the charge control circuit turns ON the charge FET Q2, and the battery 10 returns to a normal state.

In the normal state, and with reference to the time chart of FIG. 8(D), the voltage, ΔS, between S1 and S2 is:

$$\Delta S = (\text{potential of } S2) - (\text{potential of } S1) = (\text{potential of } S2) - GND(0V) = (\text{potential of } S2).$$

In the first stage ΔS is a little minus, and just after the charge FET Q2 turns OFF, ΔS becomes equal to (battery voltage)−(charge voltage).

FIG. 9 is a time chart which shows the overdischarge protecting operation of a conventional battery protective device. The graphs presented show: (A) gate voltage of the discharge FET Q1, (B) gate voltage of the charge FET Q2, (C) an overdischarge detecting voltage (overdischarge detecting signal), (D) voltage between sources S1-S2 of the discharge FET Q1 and the charge FET Q2 (S1-S2 voltage signal), (E) the state of the battery pack and (F) voltage of the battery 10 (battery voltage).

When the battery pack 1 of FIG. 6 is connected to a load device (not shown in the drawing), the battery 10 is in a discharge mode to supply power to the load. The overdischarge detecting circuit 103 monitors the voltage of the battery 10 in order not to be overdischarged. When the detected voltage is higher than the predetermined overdischarge detecting voltage (2.5V), the overdischarge detecting circuit 103 turns its output signal to an L level (LOW), which informs the discharge control circuit 101 that the battery is in a normal state. When the battery is in a normal state, the discharge control circuit 101 turns the gate G1 of the discharge FET Q1 to an H level, causing FET Q1 to turn ON and conduct discharge current. When the overdischarge detecting circuit 103 senses a lower voltage than the predetermined overdischarge detecting voltage (at time t1), the overdischarge detecting circuit 103 turns its output to a H level, which informs the discharge control circuit 101 of overdischarge (FIG. 9, line C). In the overdischarge state, the discharge control circuit 101 makes the gate G1 of the discharge FET Q1 at an L level, which turns FET Q1 OFF and cuts off the discharge current, thereby protecting battery 10 from overdischarge.

Thereafter when the load device is disconnected from the battery 10 and the charger 2 is connected, charge current starts to flow. When the overdischarge detecting circuit 103 senses a higher voltage than the predetermined release voltage (in this example, 2.8V) from overdischarge, the overdischarge detecting circuit 103 turns its output signal to an L level, which informs discharge control circuit 101 that the overdischarge state is released (FIG. 9, lines C and F, at time t2). Upon receipt of the L level signal, the discharge control circuit 101 turns ON the discharge FET Q1, and the battery 10 returns to a normal state.

On the time chart of FIG. 9(D), the S1-S2 voltage ΔS is, as said above, equal to the potential of S2. In a first stage this voltage is slightly positive, and just after the discharge FET Q1 turns OFF, it becomes the battery voltage.

While the battery is discharging, the discharge overcurrent detecting circuit 105 monitors voltage, determined by converting the current through the discharge FET Q1 and the charge FET Q2, to protect the battery 10 from overcurrent by abnormal loading or short-circuiting of a load device. When the detected voltage is lower than a predetermined overcurrent detecting voltage, the discharge overcurrent detecting circuit 105 informs the discharge control circuit 101 of a normal state. In the normal state, the discharge control circuit 101 turns ON the discharge FET Q1 to conduct discharge current. If the discharge overcurrent detecting circuit 105 senses a higher voltage than the predetermined overcurrent detecting voltage, the discharge overcurrent detecting circuit 105 informs the discharge control circuit 101 of an overcurrent state. In an overcurrent state, the discharge control circuit 101 turns OFF the discharge FET Q1 to cut off the discharge current. Thus, the battery 10 is protected from overcurrent.

FIG. 10 is a charge and discharge operation table of a conventional battery protective device. FIG. 11 shows current paths during charge and discharge operations of a conventional battery protective device that shows current flow through a discharge FET Q1 and a charge FET Q2. In the drawing, FIG. 11(A) shows charge and discharge current paths in a normal state. FIG. 11(B) shows a current path in an overcharge-protected state, and FIG. 11(C) shows a current path in an overdischarge protected state.

Discharge current shown in FIG. 11(B) flows to discharge through a parasitic diode Dp2 of the charge FET Q2 when in an overcharge protected state, between times t1 and t2 of FIG. 8. Thus, the loss by forward voltage of the parasitic diode Dp2 generates heat, which can overheat the semiconductor integrated circuit (IC) device. If the discharge occurs with a high current, the semiconductor device can be thermally destructed.

The charge current (as illustrated by arrows) shown in FIG. 11(C) flows through a parasitic diode Dp1 of the discharge FET Q1 when in an overdischarge protected state, between times t1 and t2 of FIG. 9. Thus, the same as above, the loss by forward voltage of the parasitic diode Dp1 generates heat and can overheat the semiconductor integrated circuit device. If the charge occurs with a high current, the semiconductor device can be thermally destructed.

Now when charge and/or discharge (charge/discharge) current greater than a predetermined value flows for more than a predetermined period of time continuously, current through the parasitic diodes Dp1 and Dp2 can be suppressed and thermal destruction of the semiconductor prevented if the discharge FET Q1 and the charge FET Q2 are turned ON. Thus it has been proposed for a battery protective device to detect charge/discharge current by connecting a current detecting resistor in the current path of a serially connected discharge FET Q1 and charge FET Q2. (For example, refer to Japanese Unexamined Patent Application Publication No. 2002-204534, Paragraph [0017]-[0030], FIG. 1).

Another method proposed to prevent thermal destruction of a semiconductor is to turn OFF the charge FET Q2 upon detection of discharging during an ON state of the charge FET Q2 in an overcharge state, and to turn ON the discharge FET Q1 upon detection of charging during an OFF state of the discharge FET Q1 in an overdischarge state. (For example, refer to Japanese Unexamined Patent Application Publication No. H 10-290530, Paragraph [0015]-[0029], FIG. 1). In this case, discharge is detected by a voltage drop caused by discharge current through the discharge FET which is ON, and charge is detected by a voltage drop caused by charge current through the charge FET which is ON.

The above described structure of a conventional battery protective device is enabled to turn a switch off rapidly only when current flows in an unintended direction with continuous current detection. This way the power loss can be suppressed better than by using diodes.

However since a bi-directional switch has a very low resistance to suppress power loss, an "ON" resistance of a MOS switching element in a full-ON condition is as low as from several milli-ohms (mΩ) to several tens of mΩ. When a current, for example, of one amp (1 A) flows, a voltage difference appearing between both ends of a switch is very low, such as from several millivolts (mV) to several tens of mV. Therefore it is very difficult to detect the direction of current in such a case in order to detect the voltage drop caused by charge/discharge current through charge/discharge FETs because voltage drops through them are very low.

Since the voltage difference between two points (a source and drain of an FET) is measured where neither point is at ground potential, the circuit structure for solving this current detection problem has been difficult. Where current is detected using a switch associated parasitic diode, the voltage potential of an impurity diffusion region to isolate the substrate is down to the diode's forward voltage. Thus the parasitic diode is likely to cause extra current to flow in the substrate of an integrated circuit or in a power supply circuit. Especially in a device with a bi-directional switch and a control circuit that controls the ON and OFF states of the switch that are formed in the same semiconductor substrate, the semiconductor device is likely to malfunction due to power fluctuations and/or latch up caused by current sneaking this way into the circuit part.

SUMMARY OF THE INVENTION

The invention overcomes the above-described deficiencies of conventional structures by providing a battery protective device and a semiconductor integrated circuit device which prevent thermal destruction of the semiconductor in a simple circuit configuration with low power loss, and which can reliably detect charge and discharge current as well as the current's direction.

In order to solve the above-mentioned and related problems, the present invention provides a battery protective device with a first semiconductor device which controls discharge current of a battery and a second semiconductor device which controls charge current of the battery; a control circuit which controls ON and OFF states of the first and the second semiconductor devices; and an overdischarge detecting circuit which detects overdischarge of the battery, and an overcharge detecting circuit which detects overcharge of the battery. The battery protective device further includes a charge current detector which, in an overdischarge state, detects charge current by a voltage drop of the first semiconductor device while the battery is overdischarged, and a discharge current detector which in an overcharge state, detects discharge current by a voltage drop of the second semiconductor device while the battery is overcharged. The first and the second semiconductor devices are composed of a plurality of parallel switch elements, each of which is ON-OFF controlled independently, and are interposed in series, each in a reverse direction to the charge/discharge current path of the battery. The control circuit turns the first semiconductor device ON when the overdischarge detecting circuit does not detect overdischarge. When the overdischarge detecting circuit detects overdischarge, the control circuit turns a part of the parallel switch elements ON and the rest of the elements OFF in the first semiconductor device according to the charge current detected by the charge current detector in an overdischarge state. The control circuit turns the second semiconductor device ON when the overcharge detecting circuit does not detect overcharge. When the overcharge detecting circuit detects overcharge, the control circuit turns a part of the parallel switch elements ON and the rest of the elements OFF in the second semiconductor device according to the discharge current detected by the discharge current detector in an overcharge state.

Further to solving the above-mentioned and related problems, the invention provides a semiconductor integrated circuit device with a first semiconductor device which controls discharge current of a battery and a second semiconductor device which controls charge current of the battery; a control circuit which controls ON and OFF states of the first and the second semiconductor devices; and an overdischarge detecting circuit which detects overdischarge of the battery, and an overcharge detecting circuit which detects overcharge of the battery. The battery protective device further includes a charge current detector which, in an overdischarge state, detects charge current by a voltage drop of the first semiconductor device while the battery is overdischarged, and a discharge current detector which in an overcharge state, detects discharge current by a voltage drop of the second semiconductor device while the battery is overcharged. The first and the second semiconductor devices are composed of a plurality of parallel switch elements, each of which is ON-OFF controlled independently, and are interposed in series, each in a reverse direction to the charge/discharge current path of the battery. The control circuit turns the first semiconductor device ON while the overdischarge detecting circuit does not detect overdischarge. When the overdischarge detecting circuit detects overdischarge, the control circuit turns a part of the parallel switch elements ON and the rest of the elements OFF in the first semiconductor device according to the charge current detected by the charge current detector in an overdischarge state. The control circuit turns the second semiconductor device ON when the overcharge detecting circuit does not detect overcharge. When the overcharge detecting circuit detects overcharge, the control circuit turns a part of the parallel switch elements ON and the rest of the elements OFF in the second semiconductor device according to the discharge current detected by the discharge current detector in an overcharge state.

The "ON" resistance of the battery protective device and the semiconductor integrated circuit device according to the invention is set rather high by controlling a part of the parallel switching elements formed on the semiconductor device. Current is detected by a charge current detector in an overdischarge state, and by a discharge current detector in an overcharge state. To counter the detrimental effect of a parasitic diode, the current is controlled by use of a charge control semiconductor device and a discharge control semiconductor device which are interposed in series with each other in a charge/discharge current path. This makes circuit loss low, prevents thermal destruction of the semiconductor device and makes it easy to detect charge and discharge current as well as the current's direction in a simple circuit configuration.

The battery protective device provided by the invention can suppress power loss without parasitic diode effects when current is detected through the discharge control semiconductor device and the charge control semiconductor device. Since power loss is suppressed, less heat is generated thus preventing the semiconductor device from thermal destruction. Because a switch-associated parasitic diode is not used, the voltage potential of an impurity diffusion area is not at a diode's forward potential, so extra current is not generated in the substrate and in the power supply.

A semiconductor integrated circuit device is used to form the charge and discharge control semiconductor devices and the control circuit controlling the semiconductor device's ON and OFF states on the same chip. This operates to suppress malfunction caused by power supply fluctuation and/or latch-up and the like as a result of less current sneaking into the control circuit. Further, since only a part of the parallel switch is made to turn ON, a higher "ON" resistance is obtained. An additional advantage is that the direction of current can be easily detected with high accuracy even in a very low current condition.

BRIEF DESCRIPTION OF THE DRAWINGS

FIG. 10 is a table of charge and discharge control behavior of a conventional battery protective device.

FIG. 11 is a drawing of current path of a conventional battery protective device in charge-discharge control behavior.

PREFERRED EMBODIMENT OF THE INVENTION

A preferred embodiment of the invention will be described with reference to the accompanying drawings.

Figure 1:
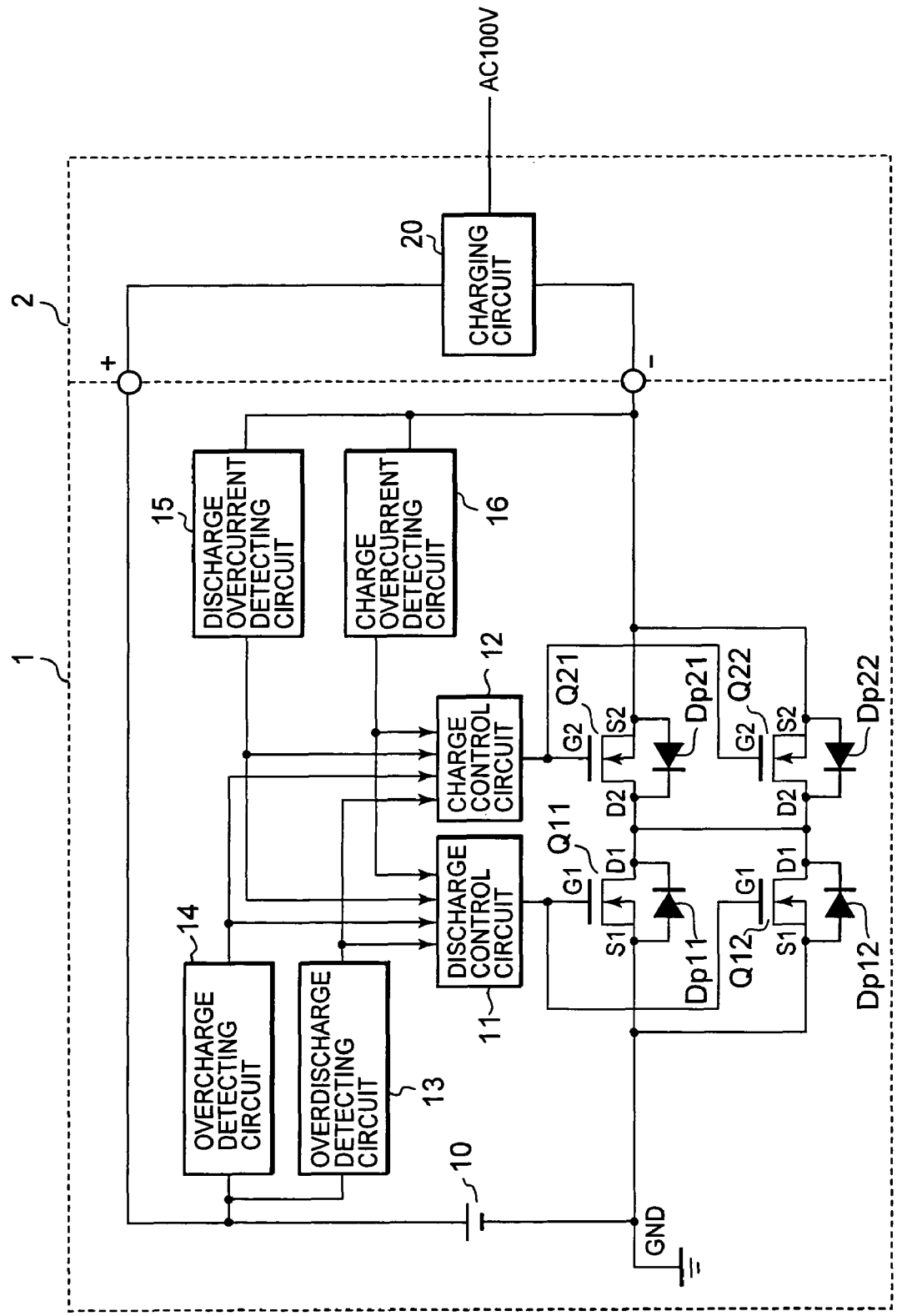
FIG. 1 is a block diagram of a circuit configuration of a battery protective device in accordance with an embodiment of the present invention.

FIG. 1 is a block diagram showing a circuit structure of the battery protective device relating to a preferred embodiment of the invention. It shows a charger 2 with a charging circuit 20 connected to a battery pack 1. The battery pack 1 includes: a battery 10; discharge FETs Q11 and Q12 for discharge control of semiconductor devices which control the discharge current of the battery 10; charge FETs Q21 and Q22 for charge control of semiconductor devices which control the charge current of the battery 10; discharge control circuit 11, which controls "ON" and "OFF" of the discharge FETs Q11 and Q12; charge control circuit 12 which controls "ON" and "OFF" of the charge FETs Q21 and Q22; an overdischarge detecting circuit 13, which detects overdischarge of the battery 10; an overcharge detecting circuit 14, which detects overcharge of the battery 10; a discharge overcurrent detecting circuit 15, which detects discharge overcurrent; and a charge overcurrent detecting circuit 16 which detects charge over current in a normal state.

The discharge overcurrent detecting circuit 15 has a discharge current detector for an overcharge state which detects discharge current by a voltage drop through the charge FETs Q21 and Q22 when the battery is in an overcharge state. The charge overcurrent detecting circuit 16 has a charge current detector for an overdischarge state which detects charge current by a voltage drop through the discharge FETs Q11 and Q12 when the battery 10 is in an overdischarge state. Both the charge current detector for an overdischarge state and the discharge current detector for an overcharge state detect the S1-S2 current between the discharge FETs Q11 and Q12 and the charge FETs Q21 and Q22. The discharge and the charge FETs are interposed in series with each other in the current path of the charge/discharge current, and detect the current direction in the path of the charge/discharge current of the battery 10. The discharge control circuit 11 and the charge control circuit 12 control the ON and OFF states of the discharge FETs Q11 and Q12 and the charge FETs Q21 and Q22, according to the results of the detected currents.

Dp11 and Dp12 are parasitic diodes of the discharge FET Q11 and FET Q12, and Dp21 and Dp22 are parasitic diodes of the charge FET Q21 and FET Q22, respectively. S1 and S2 denote sources, D1 and D2 denote drains and G1 and G2 denote gates.

Battery pack 1 has plus (+) and minus (−) output terminals of the battery 10. These output terminals become input terminals when charging the battery 10, to which the charge current is inputted from charging circuit 20 of charger 2.

The overdischarge detecting circuit 13 informs the discharge control circuit 11 of overdischarge when the battery voltage of the battery 10 drops to a lower voltage than the overdischarge voltage predetermined from the battery characteristics. The overcharge detecting circuit 14 informs the charge control circuit 12 of overcharge when the battery voltage of the battery 10 rises to an overcharge voltage that is higher than the overcharge voltage predetermined from the battery characteristics.

The discharge overcurrent detecting circuit 15 monitors the current flowing through the discharge FETs Q11 and Q12 and the charge FETs Q21 and Q22 in order to protect the battery 10 and the circuit elements thereof from an abnormal load or a load short-circuit at discharge, during which the current flowing through the discharge FETs Q11 and Q12 and the charge FETs Q21 and Q22 is to be detected. The current is measured based on the voltage at point S1 minus the voltage at point S2 in FIG. 1, referred to as S1-S2, or ΔS, as stated above. When the circuit detects a voltage higher than the discharge overcurrent detecting voltage (the positive value of the threshold voltage), it informs the discharge control circuit 11 of the state of the discharge overcurrent.

The discharge control circuit 11 turns the gate voltage of the discharge FET Q11 and FET Q12 independently to a high ("H") or low ("L") level, based on the outputs of the overdischarge detecting circuit 13 and the discharge overcurrent detecting circuit 15, to conduct or cut off the current between each drain D1 and source S1. Discharge FETs Q11 and Q12 are parallel switching elements and are independently controlled in this manner. However, while protected from overcharge when the charge FETs Q21 and Q22 are turned OFF, discharge current still flows through the parasitic diodes Dp21 and Dp22 of the charge FETs Q21 and Q22, so that with conventional structures, discharge overcurrent is not detected accurately. However, the invention's discharge overcurrent detecting circuit 15 operates to produce a discharge current detecting signal output that gives an accurate current detection.

The charge overcurrent detecting circuit 16 monitors the current flowing through the discharge FETs Q11 and Q12 and the charge FETs Q21 and Q22 in order to protect battery 10 and the circuit elements thereof from the charge overcurrent caused by an abnormal charger or abnormal charging condition. When charging, current flows through the discharge FETs Q11 and Q12 and the charge FETs Q21 and Q22, and is detected by measurement of the S1-S2 voltage. When the circuit detects a voltage lower than the charge overcurrent detecting voltage (the negative value of the threshold voltage), it informs the charge control circuit 12 of charge overcurrent.

The charge control circuit 12 turns gate voltage of the charge FET Q21 and FET Q22, independently, to the H or L level, based on the output of the overcharge detecting circuit 14 and the charge overcurrent detecting circuit 16. FET Q21 and FET Q22 are parallel switching elements, and are controlled to conduct or cut off the current between each drain D2 and source S2. However, while protected from overdischarge by the discharge FETs Q11 and Q12 being turned off, the charge current flows through the parasitic diodes Dp11 and Dp12 of the discharge FETs Q11 and Q12. This ordinarily would make the charge overcurrent not accurately detected; however, the charge overcurrent detecting circuit 16 produces a charge current detecting output signal that gives an accurate current detection.

Next, charge/discharge control operation of the above described structure of the battery protective device will be described. Here, for the purpose of describing the invention, the following values are used: the overcharge detecting voltage is 4.3V, the overcharge release voltage is 4.0V, the overdischarge detecting voltage is 2.5V, the overdischarge release voltage is 2.8V, the threshold voltage against discharge overcurrent is 0.15V, the threshold voltage against charge overcurrent is −0.15V, and "ON" resistance value of the discharge FET Q11 and FET Q12 and the charge FET Q21 and FET Q 22 is 25 milli-ohm (mΩ). It is understood that these values are for exemplary purposes only, and are not limiting as to the range of values that are usable with the invention.

Figure 2:
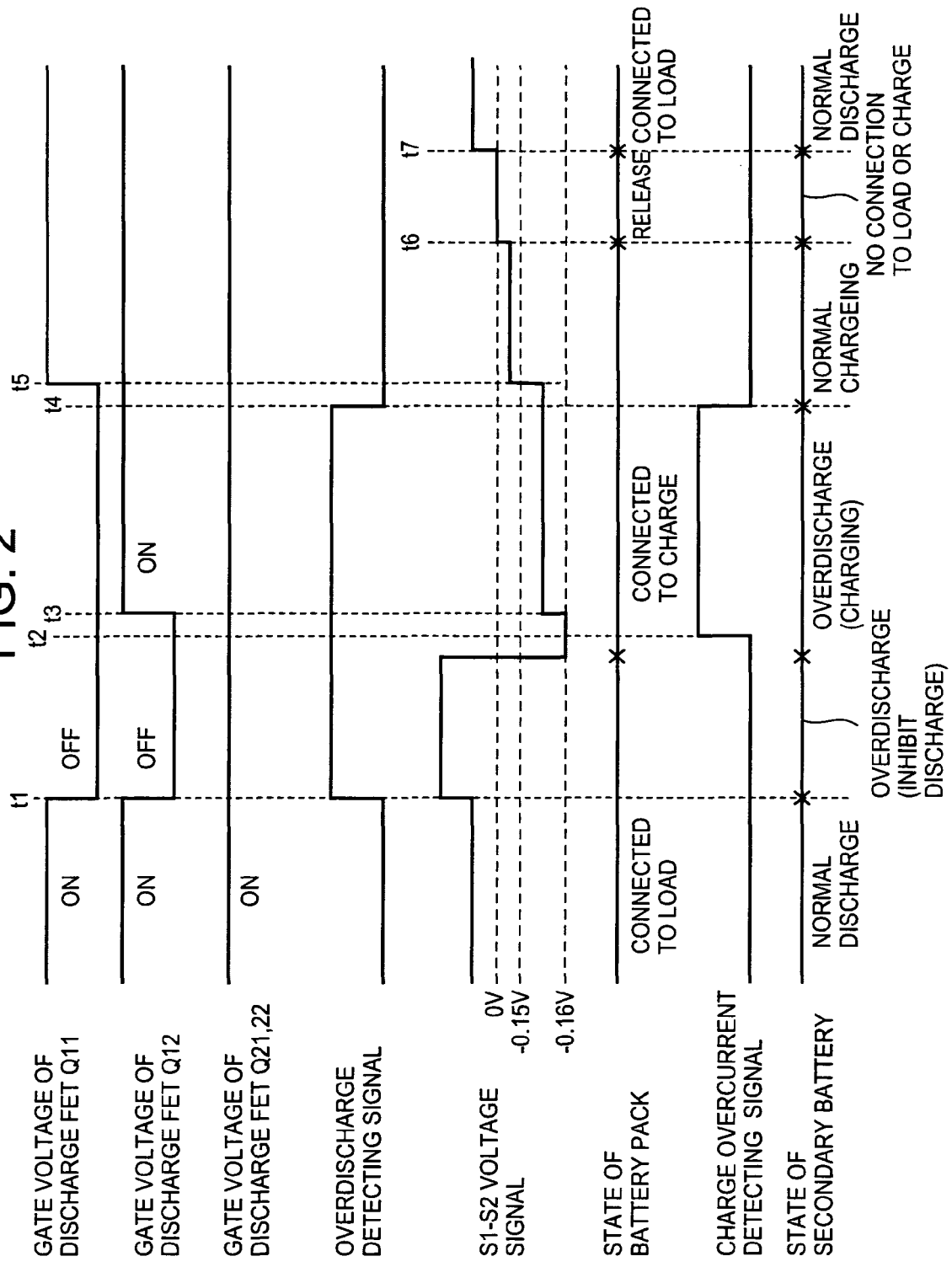
FIG. 2 is a time chart of overdischarge protection behavior of a battery protective device in accordance with an embodiment.

First, charge operation when overdischarge is detected and returning operation to normal discharge will be described. FIG. 2 is a time chart showing the operation of overdischarge protection of the battery protective device relating to a preferred embodiment. The chart shows: (A) gate voltage of the discharge FET Q11, (B) gate voltage of the discharge FET Q12, (C) gate voltage of the charge FET Q21 and FET Q22, (D) overdischarge detecting signals (overdischarge detecting voltage), (E) S1-S2 voltage of the discharge FETs Q11 and Q12 and the charge FETs Q21 and Q22, (F) a state of the battery pack, (G) charge overcurrent detecting signals, and (H) a state of the battery 10. Also note that the load device (not shown in FIG. 1) is connected in replacement for the charger 2 in the initial state, as the battery pack is loaded.

The overdischarge detecting circuit 13 monitors battery voltage in order not to overdischarge the battery 10. The circuit turns the output signal of the overdischarge detecting circuit 13 into a low or "L" level signal which informs the discharge control circuit 11 of the state of the discharge overcurrent when the battery voltage becomes higher than 2.5V which is the overdischarge detecting voltage. When the battery voltage is in a normal discharge state, the discharge control circuit 11 turns to an ON state, i.e. turns ON, the discharge FET Q11 and FET Q12 to conduct discharge current.

Since the load device will stop discharging before the battery 10 is overdischarged by itself under a normal use, overdischarge will not be detected. However, in the case where the load device becomes out of order and continues discharging even after the overdischarge occurs, the battery voltage will go down to a level lower than 2.5V, which is the overdischarge detecting voltage (time t1). Then, the overdischarge detecting circuit 13 turns its output signal into a high or "H" level signal which informs the discharge control circuit 11 of overdischarge. When the discharge control circuit 11 receives the overdischarge detecting signal, it turns OFF the discharge FETs Q11 and Q12 which cuts off the discharge current so that the battery 10 cannot further discharge. By doing so, the source S2 of the charge FETs Q21 and Q22 will receive the positive voltage of the battery 10, and the overdischarged battery 10 will be protected under this state where discharging is prohibited.

Here, the S1-S2 voltage shown in the time chart in FIG. 2 is the potential of the source S2. S2 initially starts at plus (+) and just after the discharge FETs Q11 and Q12 are turned OFF, S2 becomes the battery voltage of the battery 10.

When the fault load device, or the like, is removed from the protective device of the battery and the charger 2 is connected, the charge current flows into the battery 10 and the S1-S2 voltage drops down to −0.6V. Because the battery 10 is charged through the parasitic diodes Dp11 and Dp12 of the discharge FETs Q11 and Q12 which are turned OFF, and because a forward voltage of the parasitic diodes Dp11 and Dp12 of the discharge FETs Q11 and Q12 occurs even with a little charge current flowing, voltage S2 at the source 2 of the charge FETs Q21 and Q22 drops down relative to the voltage S1 of the source 1 of the discharge FETs Q11 and Q12. Since the S1-S2 voltage is lower than the threshold voltage (−0.15V) at this time, if the charge overcurrent detecting circuit 16 detects such voltage at time t2, it will change the charge overcurrent detecting signal into a H level, and inform the discharge control circuit 11 that overcurrent is flowing.

When the discharge control circuit 11 receives the charge overcurrent detecting signal, it turns ON only the discharge FET Q12 (time t3). At this time, the S1-S2 voltage exceeds a certain level of the voltage at a negative potential by the discharge FET Q12 which is in an ON state, and the charge overcurrent detecting circuit 16 is able to detect the current direction continuously. When the battery 10 is released from overdischarge by such continuous charge operations (time t4), it returns to a normal mode where charge/discharge is possible and discharge control circuit 11 turns ON both of the discharge FETs, Q11 and Q12, irrespective of current direction (time t5).

After the discharge FETs Q11 and Q12 are fixed at "ON" as described above, and by re-connecting the load device at time t7 in replacement of the charger 2, which was removed at time t6, the battery protective device will return to the normal discharge state. Next, the discharge operation when an overcharge state is detected and the returning operation to the normal charge will be described.

Figure 3:
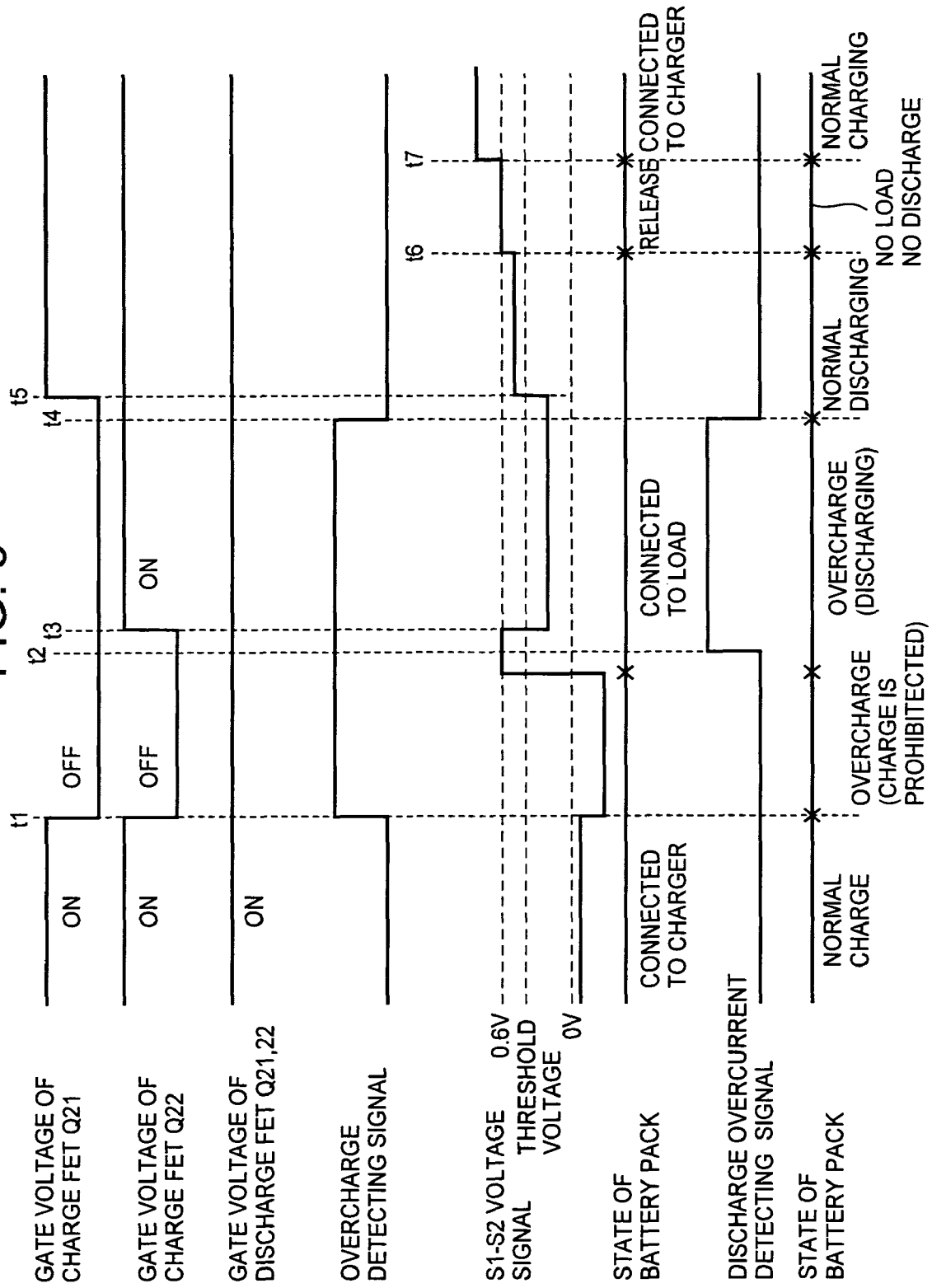
FIG. 3 is a time chart of overcharge protective behavior of a battery protective device in accordance with the embodiment.

FIG. 3 is a time chart showing operation of overcharge protection of the battery protective device relating to a preferred embodiment. The chart shows: (A) gate voltage of the charge FET Q21, (B) gate voltage of the charge FET Q22, (C) gate voltage of the discharge FET Q11 and FET Q12, (D) overcharge detecting signal (overcharge detecting voltage), (E) S1-S2 voltage of the discharge FETs Q11 and Q12 and the charge FETs Q21 and Q22, (F) a state of the battery pack, (G) discharge overcurrent detecting signal, and (H) a state of the battery 10.

When the battery protective device is connected to the fault charger 2, or the like, and when excess charge current continues to conduct even after the battery voltage of the battery 10 exceeds 4.2V, and when the battery voltage exceeds 4.3V of overcharge detecting voltage (time t1), the overcharge detecting circuit 14 will change its output signal to an H level, and inform the charge control circuit 12 of overcharge. When the charge control circuit 12 receives the overcharge detecting signal, it will turn OFF the charge FETs Q21 and Q22 to cut off charge current so not to proceed with charging of the battery 10. Thus, the battery 10 will be under this protected state where charging is prohibited.

Here, in the time chart in FIG. 3, the voltage ΔS between S1 and S2 is:

$$\Delta S = (\text{potential of } S2) - (\text{potential of } S2) = (\text{potential of } S2) - GND(0V) = (\text{potential of } S2),$$

so that ΔS is initially a little minus and becomes (battery voltage)−(charge voltage) just after the charge FETs Q21 and Q22 are turned OFF.

When the fault charger 2, or the like, is removed from the protective device of the battery, and the load device is connected, discharge current flows from the battery 10 to the load device. Initially, since the current is discharged through the parasitic diode Dp21 of the charge FETs Q21 and Q22, voltage at the source S2 of the charge FETs Q21 and Q22 will rise to +0.6V, even with a low discharge current, due to the forward voltage of the parasitic diode Dp21 of the charge FETs Q21 and Q22 relative to the source S1 voltage of the discharge FETs Q11 and Q12. Since voltage S1-S2 exceeds the threshold voltage (+0.15V) relating to discharge overcurrent, discharge overcurrent will flow. When the discharge overcurrent detecting circuit 15 detects such current at time t2, it turns the discharge overcurrent detecting signal into a H level which informs the charge control circuit 12 that overcurrent is flowing.

When the charge control circuit 12 receives the discharge overcurrent detecting signal, it turns ON only the charge FET Q22 (time t3). At this time, the S1-S2 voltage exceeds a predetermined positive potential by the ON state of charge FET Q22, and the discharge overcurrent detecting circuit 15 is able to detect the current direction continuously. When the battery 10 is released from overdischarge by such continuous discharge operations (time t4), the battery protective device returns to a normal discharge mode where charge/discharge is possible, and turns ON both charge FETs Q21 and Q22 irrespective of the current direction (time t5).

After the charge FET Q21 and FET Q22 are fixed at "ON" as described above, and by re-connecting the charger 2 at time t7 in place of the load device which was removed at time t6, the battery protective device will return to the normal charge state. Next, the parallel switching circuits (bidirectional switches) will be described, which are interposed in series with each other in reverse direction against the charge/discharge current paths.

Figure 4:
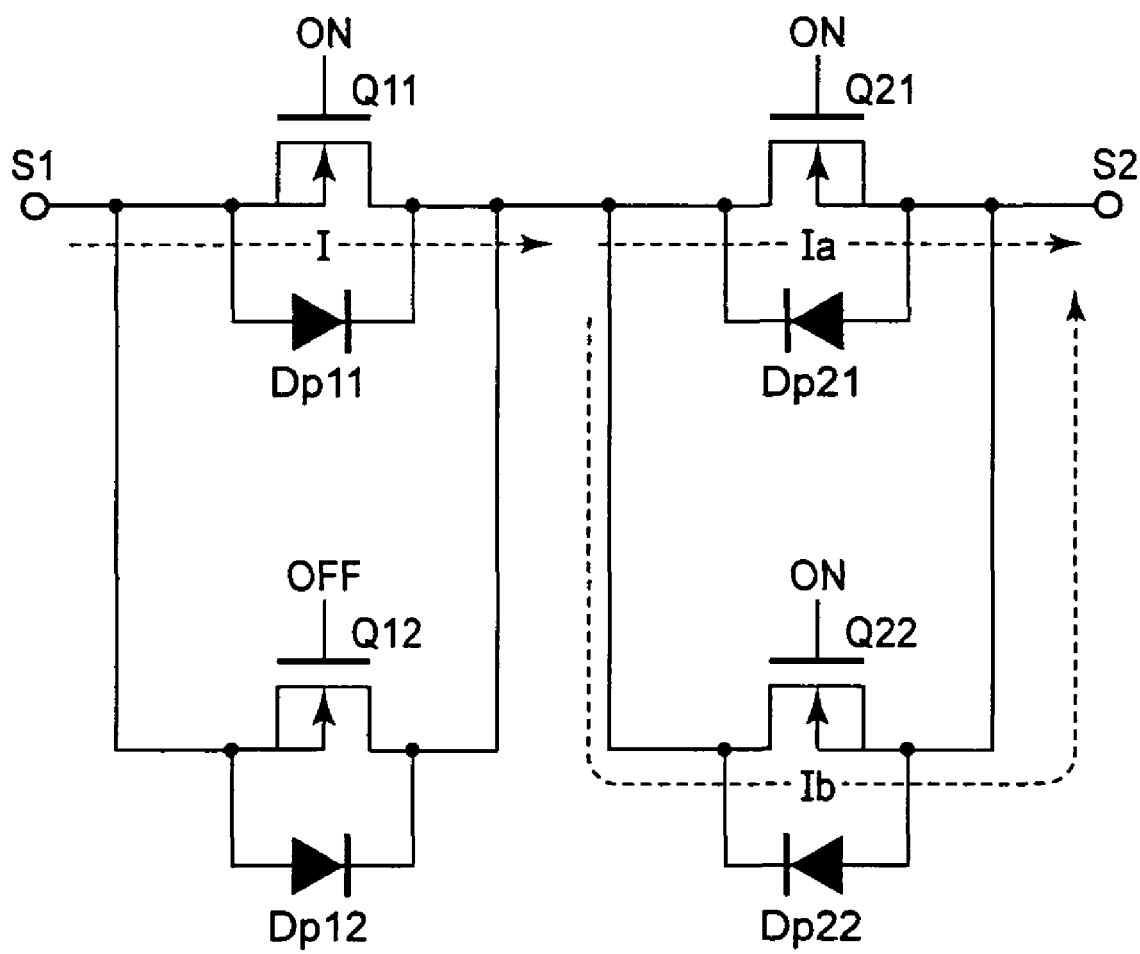
FIG. 4 is a drawing of a charge current path through each FET forming a bi-directional switch.

FIG. 4 is a drawing showing the charge current paths where the current flows into each FET that compose the bidirectional switch. In the bidirectional switch of the prior art, as shown in FIG. 11(c), all charge current volume flowing therein is pre-determined by the parasitic diode Dp1 of the discharge FET Q1. On the other hand, since in the invention each gate is led from the discharge FETs Q11 and Q12, connected in parallel, to control discharge current, the discharge control circuit 11 can exert control by turning on only a part of the discharge FET Q12 (FIG. 1).

That is to say, the discharge FET Q11 and FET Q12, each of which the discharge control circuit 11 controls to turn ON and OFF independently, are connected in parallel in order to lower the "ON" resistance of the bidirectional switch which controls discharge current of the battery 10. When overdischarge is detected, the charge FET Q21 and FET Q22 will both be controlled to be turned ON by the charge control circuit 12 as FIG. 4 shows. Charge current (I) flowing through in the ON state of discharge FET Q1 will diverge into charge current Ia and charge current Ib in the parallel circuits of charge FET Q21 and charge FET Q22. Therefore gate terminals of the charge FETs Q21 and Q22 may be common in this case.

Although FIG. 4 shows the use of two discharge FETs Q11 and Q12 as parallel elements, since the "ON" resistance of the charge current paths will vary depending on the number of the parallel elements, it is possible to adjust the number of elements so that the resistance can become a desired value. It is also possible to make each gate terminal common to the gates of all the parallel elements.

Thus, in a preferred embodiment, the discharge FETs Q11 and Q12, which are connected in parallel, will not entirely turn off at an overdischarge state. Instead, a part of discharge FET Q1 (consisting in the example of the embodiment as consisting of FETs Q11 and Q12) will be turned ON after ascertainment of current direction. By making the "ON" resistance of the discharge FET Q11 lower than the converted direct current resistance of the parasitic diode Dp12, power loss due to charge current will be less than that of using an associated parasitic diode.

The described operation in the overdischarge state is applicable in a similar way to the discharge FET Q11 and FET Q12 at an overcharge state. However, since current will, in general, hardly flow through a diode until voltage across a diode reaches the diode's forward voltage Vf, if the voltage is lower than the forward voltage Vf, the "ON" resistance of the FET is lower than that of an associated parasitic diode whatever is the FET size. On the other hand, if "ON" resistance is too high for current, the source-drain voltage shall be higher than the diode's forward voltage Vf as a result of the voltage drop caused by the "ON" resistance of the FET and a certain current. Then, for the purpose of preventing parasitic current as well as power loss, it is necessary in practice to adjust the voltage drop generated by the "ON" resistance of the FET at a certain desired current so that the voltage drop should not reach the forward voltage Vf in order for the associated parasitic diode not to turn ON at a desired charge current (or discharge current).

As described above, if only a part of the charge FET Q21 and FET Q22, or the discharge FET Q11 and FET Q12, are turned ON, it will be possible to configure a higher "ON" resistance compared to the case of an "all ON" state. Even in the case of a minute current, it is possible to detect the current correctly since the voltage difference between S1 and S2 is high enough. Here, two of the charge/discharge FETs each connected in parallel are shown, but it can be more than two.

Figure 5:
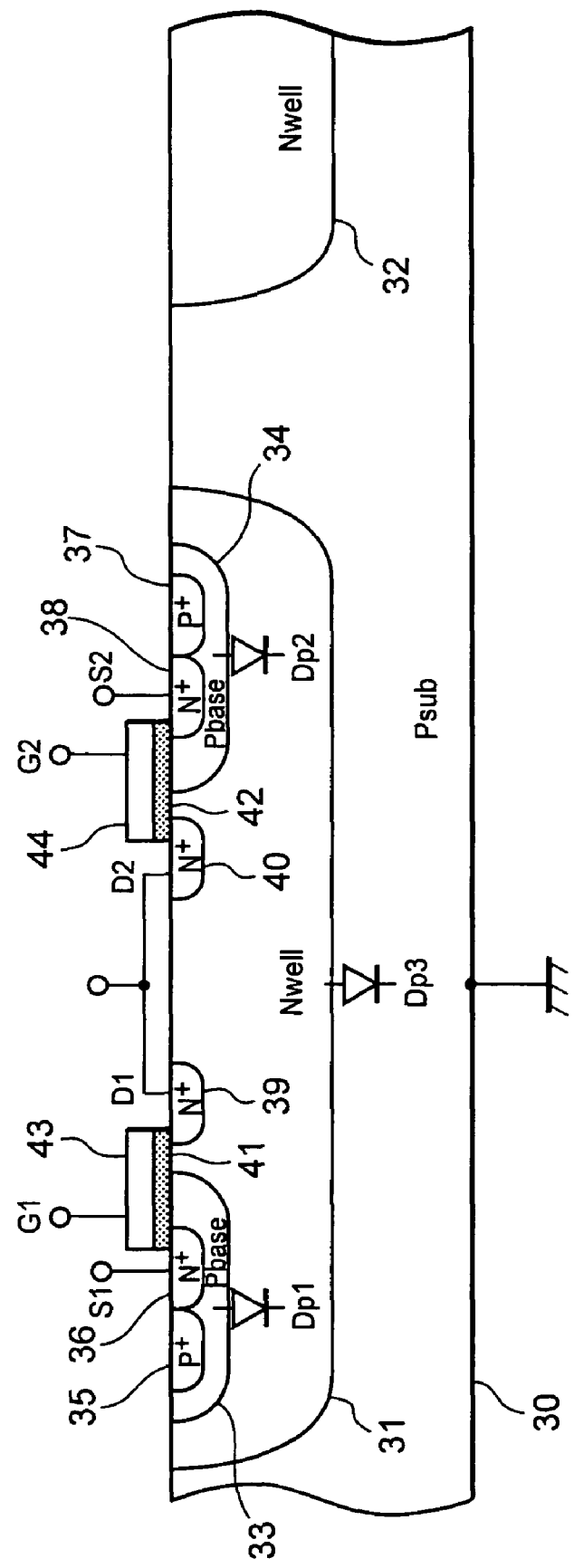
FIG. 5 is a cross-sectional view of a circuit part of a substrate, forming a bi-directional switch in a semiconductor integrated circuit device.
Figure 6:
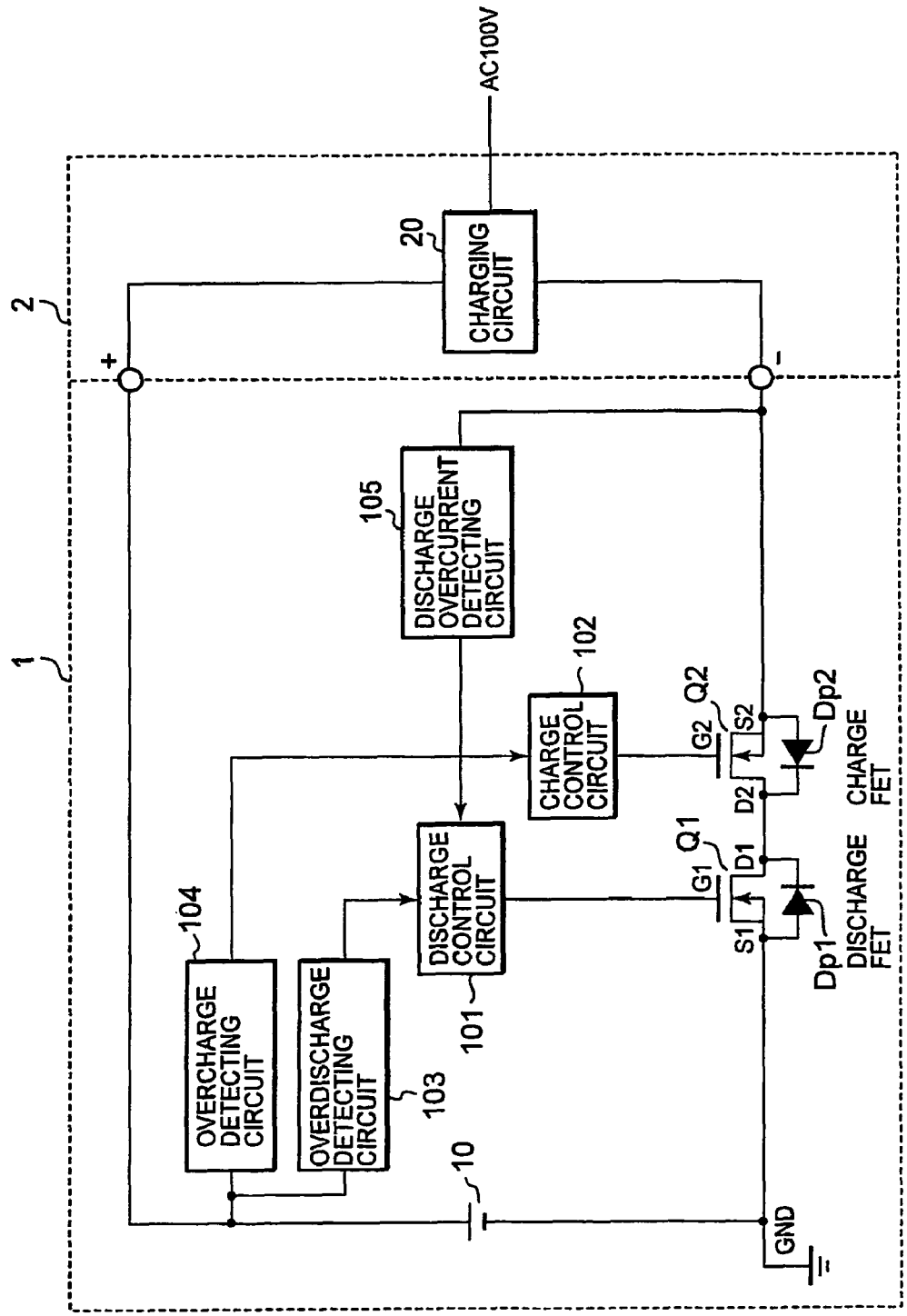
FIG. 6 is a block diagram of a circuit configuration of a conventional battery protective device contained in a battery pack.
Figure 7:
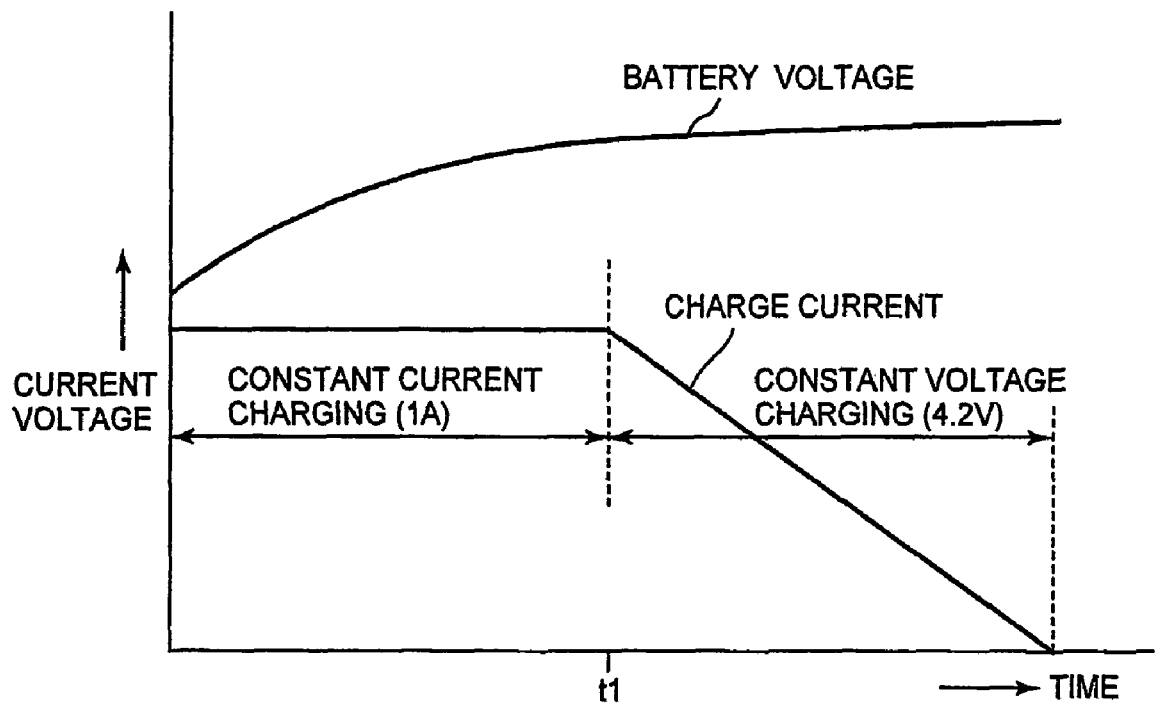
FIG. 7 is a graph of the charging control characteristics of a conventional battery.
Figure 8:
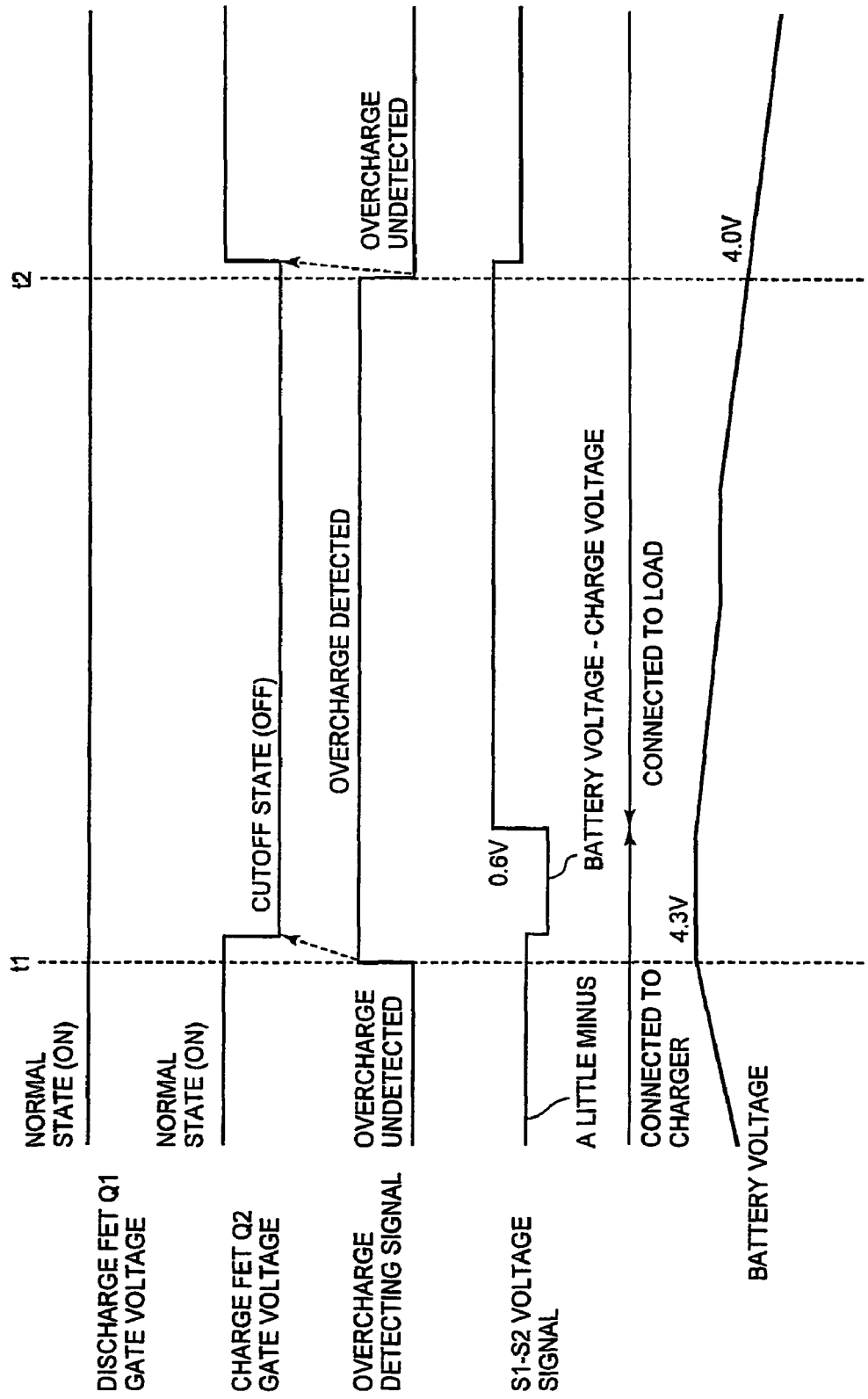
FIG. 8 is a time chart of overcharge protection behavior of a conventional battery protective device.
Figure 9:
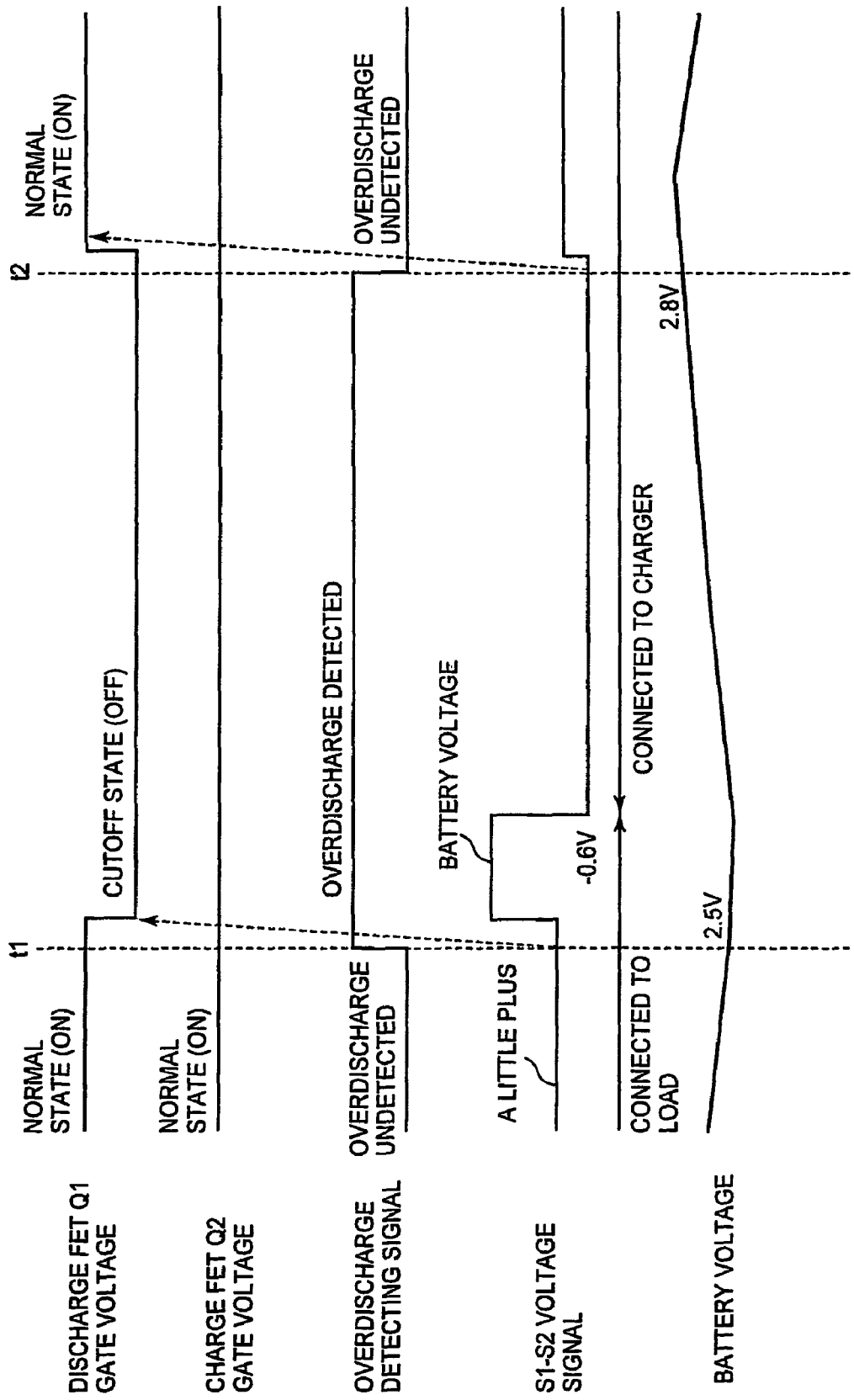
FIG. 9 is a time chart of overdischarge protection behavior of a conventional battery protective device.

Next, the semiconductor integrated circuit relating to the invention will be described. FIG. 5 is the cross-sectional view of a substrate showing the part of a circuit composing a bidirectional switch in the semiconductor integrated circuit.

A P-type semiconductor substrate (Psub) 30 is composed of, for example, a silicon semiconductor substrate, and N well areas (Nwell), which in this example consist of two, well area 31 and well area 32, formed adjacent to each other on the main surface of the substrate. The substrate's underside surface is grounded. In well area 31, p-base areas (Pbase) 33 and 34 are selectively formed longitudinally spaced in separate areas as shown in FIG. 5. The p-base areas 33, 34 become substrate areas for n-channel type MOS FETs Q1 and Q2. In the other well area 32, circuit elements which compose other battery protective devices are formed.

P+ diffusion region 35 and N+ diffusion region 36 are formed selectively in the p-base area 33 within well area 31. P+ diffusion region 35 serves as a substrate extracting electrode for a MOSFET Q1 and N+ diffusion region 36 serves as a source S1. Similarly, P+ diffusion region 37 and N+ diffusion region 38 are formed selectively in the p-base diffusion region 34. P+ diffusion region 37 serves as a substrate extracting electrode for a MOS FET Q2, and N+ diffusion region 38 serves as a source S2. Also, N+ diffusion regions 39 and 40 are formed adjacent to P base areas 33 and 34, each in the well area 31, and the drains D1 and D2 for MOSFET Q1 and Q2 are extracted therefrom and commonly connected to each other. Further, gate electrodes 43 and 44 are formed, such as by use of an n-type poly-silicon layer, by doping through gate insulating layers 41 and 42. Each gate electrode is formed in the intermediate area between N+ diffusion areas 36 and 39 and the intermediate area between N+ diffusion areas 38 and 40.

Since both the sources S1 and S2, and the drains D1 and D2, are structured separately from the p-type semiconductor substrate 30 in the n-channel type MOSFET Q1 and Q2, the parasitic diodes Dp1 and Dp2 are situated on the junction area of the P base areas 33 and 34 with well area 31, and the parasitic diode Dp3 is situated on the junction area of the well area 31 with the p-type semiconductor substrate 30.

Next, the differences between the semiconductor integrated circuit device with the structure above and the prior art will be described. Multiple gate electrodes 43 and 44 are formed in the n-channel type MOSFET Q1 and Q2 composing a bidirectional switch of this semiconductor integrated circuit device. Each gate electrode is overlaid in a longitudinal direction as shown in FIG. 5. Gates G1 and G2 are extracted from gate electrodes 43 and 44 respectively. Further, a source of one MOSFET Q1 (the discharge FET) is to be the ground (GND) standard, and a source of the other MOSFET Q2 (the charge FET) is to be charged with a negative voltage at charging to flow charge current, and is discharged with the positive potential at discharging to flow the discharge current.

In this kind of bidirectional switch, it is possible to turn ON a part of the MOSFET Q2 by tuning on the MOSFET Q1 when overcharge is detected, as shown in FIG. 3. Further, it is possible to turn ON a part of the MOSFET Q1 by tuning ON the MOSFET Q2 when overdischarge is detected, as shown in FIG. 2. Since the device of the prior art turns OFF the MOSFET Q2 entirely when discharge current is conducted when overcharge is detected, the current flows from the P base area 34 of the MOSFET Q2 side to the well area 31 through the parasitic diode Dp2. Similarly, since the prior art turns OFF the MOSFET Q1 entirely when charge current is conducted when overdischarge is detected, the well area 31 becomes a negative potential and current flows from the P base area 33 of the MOSFET Q1 side to the well area 31 through the parasitic diode Dp1. Accordingly, current will be injected from the well area 31 to the P base area 34 in each case simultaneously.

That is to say, since the disclosed semiconductor integrated circuit according to a preferred embodiment has a structure such that when overcharge or overdischarge is detected, only a part of the MOSFET of the bidirectional switch can be turned ON, flow charge/discharge current is controlled so as not to flow through the parasitic diodes Dp11 and Dp12. This is unlike the prior art where the bidirectional switch is turned off entirely. Accordingly, even if the control circuit is not integrated into the same chip, and even if no other separate well areas are formed in the p-type semiconductor substrate 30 where the well areas 31 and 32 are formed, the described semiconductor integrated circuit makes it possible to prevent the occurrence of a parasitic current to the circuit adjacent to the battery protective device, and thus malfunctions, including a latch-up, a voltage drop, etc., are significantly prevented.

As described above, this battery protective device is able to detect amplitude and direction of current passing through a bidirectional switch, without conducting a current into the parasitic diodes Dp1 and Dp2. Thus, since voltage exceeding the diode forward voltage Vf is not applied at all times to the junction surface of well area 31 with P base areas 33 and 34, and is not applied to the junction surface of well area 31 with the p-type semiconductor substrate 30, unnecessary charge which may cause circuit malfunctions is prevented from flowing into the well area 32 formed adjacent to the bidirectional switch in the p-type semiconductor substrate 30, and secured overcurrent protection operation is thereby achieved.

I claim:

1. A device for protecting a battery from overcharging and overdischarging, comprising:
    a first semiconductor device with a first plurality of parallel switch elements configured to control a discharge current from the battery;
    a second semiconductor device with a second plurality of parallel switch elements configured to control a charge current to the battery;
    a control circuit configured independently to control an ON/OFF state of each of switch elements of the first and second semiconductor devices, in response to a signal that reflects a characteristic of a current in the semiconductor device that is indicative of an overdischarged or overcharged state of the battery, the control circuit being configured selectively to exert said control over said first or second plurality of parallel switch elements according to whether the current to be controlled is the discharge current or the charge current, the first and second semiconductor devices being interposed in series with each other, so that current discharged from the battery passes through the first and second plurality of switch elements in one direction and current charging the battery passes through the first and second plurality of switch elements in an opposite direction;
    a charge current detector, coupled to said control circuit and configured to detect the charge current according to a voltage drop on the first semiconductor device when the battery is in the overdischarged state;
    a discharge current detector, coupled to said control circuit and configured to detect the discharge current according to a voltage drop on the second semiconductor device when the battery is in an overcharged state;
    an overdischarge detecting circuit, coupled to said control circuit and configured to detect the overdischarged state of the battery; and
    an overcharge detecting circuit, coupled to said control circuit and configured to detect the overcharged state of the battery,
    wherein the control circuit is configured to turn the first plurality of parallel switch elements ON when the overdischarge detecting circuit does not detect the overdischarged state of the battery, and to turn at least one of the first plurality of parallel switch elements ON and the rest of said first plurality of parallel switch elements OFF according to the charge current detected by the charge current detector when the overdischarge detecting circuit detects an overdischarged battery condition, and
    wherein the control circuit is further configured to turn the second plurality of parallel switch elements ON when the overcharge detecting circuit does not detect an overcharged state of the battery, and to turn at least one of the second plurality of parallel switch elements ON and the rest of said second plurality of parallel switch elements OFF according to the discharge current detected by the discharge current detector when the overcharge detecting circuit detects an overcharged battery condition.

2. The battery protective device as in claim 1, wherein the overdischarge detecting circuit is a part of a discharge overcurrent detecting circuit configured to detect discharge overcurrent, and the overcharge detecting circuit is a part of a charge overcurrent detecting circuit configured to detect charge overcurrent at a normal state of the battery.

3. The battery protective device as in claim 2, wherein said discharge overcurrent detecting circuit and said charge overcurrent detecting circuit are configured to detect discharge current and charge current from a voltage between two ends of said first semiconductor device and said second semiconductor device connected in series, respectively.

4. The battery protective device as in claim 3, wherein said discharge overcurrent detecting circuit and said charge overcurrent detecting circuit are configured to detect a potential at a first end of said serially connected semiconductor devices while a second end is connected to a base potential.

5. The secondary battery protective device according to claim 1, wherein said control circuit turns on said first semiconductor device while said overcharge detecting circuit detects overcharge and turns on a part of said parallel switch elements of said second semiconductor device for a predetermined period of time if said detecting means of charge current at an overdischarge state detects said charge current.

6. The secondary battery protective device according to claim 1, wherein said control circuit turns on said second semiconductor device while said overdischarge detecting circuit detects over discharge and turns on a part of said parallel switch elements of said first semiconductor device for a predetermined period of time if said detecting means of charge current at an overdischarge state detects said charge current.

7. The secondary battery protective device according to claim 1, wherein said first semiconductor device and said second semiconductor device are composed of a plurality of MOS semiconductor switches in parallel.

8. A device for protecting a battery from overcharging and overdischarging, comprising:
    a first semiconductor device with a first plurality of parallel switch elements configured to control a discharge current from the battery;
    a second semiconductor device with a second plurality of parallel switch elements configured to control a charge current to the battery;

a control circuit configured independently to control an ON/OFF state of each of switch elements of the first and second semiconductor devices, in response to a signal that reflects a characteristic of a current in the semiconductor device that is indicative of an overdischarged or overcharged state of the battery, the control circuit being configured selectively to exert said control over said first or second plurality of parallel switch elements according to whether the current to be controlled is the discharge current or the charge current, the first and second semiconductor devices being interposed in series with each other, so that current discharged from the battery passes through the first and .second plurality of switch elements in one direction and current charging the battery passes through the first and second plurality of switch elements in an opposite direction;

a charge current detector, coupled to said control circuit and configured to detect the charge current according to a voltage drop on the first semiconductor device when the battery is in the overdischarged state;

a discharge current detector, coupled to said control circuit and configured to detect the discharge current according to a voltage drop on the second semiconductor device when the battery is in a overcharged state;

an overdischarge detecting circuit, coupled to said control circuit and configured to detect the overdischarged state of the battery; and an overcharge detecting circuit, coupled to said control circuit and configured to detect the overcharged state of the battery, wherein the control circuit is configured to turn the first plurality of parallel switch elements ON when the overdischarge detecting circuit does not detect the overdischarged state of the battery, and to turn at least one of the first plurality of parallel switch elements ON and the rest of said first plurality of parallel switch elements OFF according to the charge current detected by the charge current detector when the overdischarge detecting circuit detects an overdischarged battery condition.

9. A device for protecting a battery from overcharging and overdischarging, comprising:

a first semiconductor device with a first plurality of parallel switch elements configured to control a discharge current from the battery;

a second semiconductor device with a second plurality of parallel switch elements configured to control a charge current to the battery;

a control circuit configured independently to control an ON/OFF state of each of switch elements of the first and second semiconductor devices, in response to a signal that reflects a characteristic of a current in the semiconductor device that is indicative of an overdischarged or overcharged state of the battery, the control circuit being configured selectively to exert said control over said first or second plurality of parallel switch elements according to whether the current to be controlled is the discharge current or the charge current, the first and second semiconductor devices being interposed in series with each other, so that current discharged from the battery passes through the first and .second plurality of switch elements in one direction and current charging the battery passes through the first and second plurality of switch elements in an opposite direction;

a charge current detector, coupled to said control circuit and configured to detect the charge current according to a voltage drop on the first semiconductor device when the battery is in the overdischarged state;

a discharge current detector, coupled to said control circuit and configured to detect the discharge current according to a voltage drop on the second semiconductor device when the battery is in a overcharged state;

an overdischarge detecting circuit, coupled to said control circuit and configured to detect the overdischarged state of the battery; and an overcharge detecting circuit, coupled to said control circuit and configured to detect the overcharged state of the battery, wherein the control circuit is configured to turn the second plurality of parallel switch elements ON when the overcharge detecting circuit does not detect an overcharged state of the battery, and to turn at least one of the second plurality of parallel switch elements ON and the rest of said second plurality of parallel switch elements OFF according to the discharge current detected by the discharge current detector when the overcharge detecting circuit detects an overcharged battery condition.

* * * * *